US006436834B1

(12) United States Patent
Lee et al.

(10) Patent No.: US 6,436,834 B1
(45) Date of Patent: Aug. 20, 2002

(54) CHEMICAL-MECHANICAL ABRASIVE COMPOSITION AND METHOD

(75) Inventors: Tsung-Ho Lee, Ping Tong Hsien; Kang-Hua Lee; Tsui-Ping Yeh, both of Kaohsiung, all of (TW)

(73) Assignee: Eternal Chemical Co., Ltd. (TW)

( * ) Notice: Subject to any disclaimer, the term of this patent is extended or adjusted under 35 U.S.C. 154(b) by 0 days.

(21) Appl. No.: 09/611,831

(22) Filed: Jul. 7, 2000

(30) Foreign Application Priority Data

Jul. 8, 1999 (TW) ........................................ 88111611 A

(51) Int. Cl.$^7$ ............................................... H01L 21/00
(52) U.S. Cl. ......................... 438/693; 216/38; 216/89; 252/79.2; 252/79.4; 438/745; 438/754; 438/756
(58) Field of Search ..................... 216/89, 38; 438/693, 438/745, 754, 756; 156/345; 252/79.2, 79.4; 106/20

(56) References Cited

U.S. PATENT DOCUMENTS

| 5,084,071 A | 1/1992 | Nenadic et al. |
| 5,114,437 A | 5/1992 | Takeuchi et al. |
| 5,209,816 A | 5/1993 | Yu et al. |
| 5,225,034 A | 7/1993 | Yu et al. |
| 5,336,542 A | 8/1994 | Wirth |
| 5,340,370 A | 8/1994 | Cadien et al. |
| 5,516,346 A | 5/1996 | Cadien et al. |
| 5,733,819 A | 3/1998 | Kodama et al. |
| 5,759,917 A | 6/1998 | Grover et al. |
| 5,860,848 A | 1/1999 | Loncki et al. |
| 5,861,054 A | 1/1999 | Miyashita et al. |
| 5,891,205 A | 4/1999 | Picardi et al. |
| 6,027,554 A | 2/2000 | Kodama et al. |

FOREIGN PATENT DOCUMENTS

EP  0 984 049 A1  3/2000

*Primary Examiner*—William A. Powell
(74) *Attorney, Agent, or Firm*—Scully, Scott, Murphy & Presser

(57) ABSTRACT

The invention provides a chemical-mechanical abrasive composition for use in semiconductor processing, which comprises an aqueous medium, an abrasive, and an abrasion accelerator. The abrasion accelerator mainly functions to enhance the removal rate of the substances to be removed, and selected from the compounds of the following formula, the acid-addition salts thereof, or mixtures of two or more of the foregoing compounds and salts:

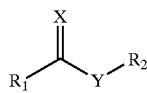

wherein X and Y are independently lone-pair electrons containing atoms or atomic groups; and $R_1$ and $R_2$ are independently H, alky, amino, aminoalkyl, or alkoxy. The chemical-mechanical abrasive composition of the invention may optionally comprise an acidic component and/or a salt thereof, so as to further enhance the abrasion rate. The invention further provides a method of using the above chemical-mechanical abrasive composition for polishing the surface of a semiconductor wafer.

14 Claims, 2 Drawing Sheets

CHEMICAL-MECHANICAL ABRASIVE COMPOSITION AND METHOD

FIELD OF THE INVENTION

The invention pertains to a chemical-mechanical abrasive composition and method. The chemical-mechanical abrasive composition is useful in polishing the surface of a semiconductor wafer.

BACKGROUND AND OBJECT OF THE INVENTION

Chemical-mechanical polishing (CMP) is a planarization technique which was developed to address the problem associated with the difficulty in focusing during a photolithography process for producing integrated circuits due to the difference in the thickness of deposited films. The chemical-mechanical polishing technique was first applied to the production of the elements with a size in the order of 0.5 microns. With the reduction in the size of elements, the chemical-mechanical polishing technique was applicable to an creased number of layers. Until the elements were developed to be in the order of 0.25 microns, the chemical-mechanical polishing became an important and essential planarization technique. In general, the polishing method for producing a wire circuit comprises mounting a semiconductor wafer on a spinning platen equipped with an abrasive head and applying an abrasive slurry comprising abrasive particles and chemical additives to the surface of the wafer to enhance the abrasion performance. In fact, the CMP technique is the one which first modifies the surface to be polished by changing the chemical properties of the surface and then removes the modified surface in a mechanically abrasive manner.

During polishing methods, different chemical-mechanical abrasive slurries should be used with reference to different designs and production processes for various IC patterns. With respect to the polishing of a dielectric layer, commonly known or commercialized abrasive slurries are normally adjusted to be in the basic pH range, i.e. from 10 to 11.5, so as to enhance the removal rate of the dielectric layer. Alternatively, using $CeO_2$ or $Si_3N_4$ particles to enhance the abrasion rate was previously taught. For example, EP 0 786 504 A2 discloses a polishing composition having a high selectivity for polishing silicon dioxide relative to silicon nitride, said composition comprising silicon nitride particles, water and an acid. U.S. Pat. No. 5,759,917 discloses a chemical-mechanical polishing composition and method for polishing silicon dioxide and silicon nitride in the production of semiconductors and integrated circuits. The composition of U.S. Pat. No. 5,759,917 has a high selectivity for polishing silicon dioxide relative to silicon nitride and comprises a salt, a soluble cerium, and a carboxylic acid, and has a pH ranging from 3 to 11. U.S. Pat. No. 5,861,054 discloses a polishing composition for use in polishing silicon dioxide and silicon nitride with a high selectivity for silicon dioxide relative to silicon nitride, which composition comprises an acidic solvent and silicon nitride with a primary particle size in the range of from 0.01 to 1000 nm. U.S. Pat. No. 5,891,205 discloses a chemical-mechanical polishing composition for polishing semiconductor devices, which composition comprises an alkaline aqueous dispersion that contains mixed particles of cerium oxide and silicon dioxide. In yet another alternative, it has been previously taught to use harder $Al_2O_3$ abrasive particles to enhance the abrasion rate. For example, U.S. Pat. No. 5,084,071 discloses a method for polishing an electronic component substrate using of a chemical-mechanical polishing slurry, which polishing slurry comprises no more than 1 weight percent of alumina, abrasive particles (e.g. $SiO_2$, $CeO_2$, SiC, $Si_3N_4$, or $Fe_2O_3$ particles), a transition metal chelated salt (e.g. ammonium iron EDTA) for use as a polishing accelerator, and a solvent for said salt. U.S. Pat. No. 5,336,542 discloses a polishing composition comprising alumina abrasive particles and a chelating agent selected from the group consisting of polyaminocarboxylic acid (e.g. EDTA) and the sodium and potassium salts thereof. The composition of U.S. Pat. No. 5,336,542 may further comprise boehmite or an aluminum salt.

One object of the present invention is to provide a chemical-mechanical abrasive composition which can effectively enhance the removal rate of a dielectric layer in either an acidic or a basic medium. The materials which can be used as dielectrics include silicon dioxide, silicon nitride, borophosphosilicate glass (BPSG), and those having a low dielectric constant (low-k), and the composites thereof. It has been discovered that the chemical-mechanical abrasive composition of the present invention is also effective in polishing polysilicon.

In the polishing method for semiconductor devices, as shown in FIG. 1, a chemical-mechanical polishing slurry should be used to planarize the silicon dioxide layer and stop at the silicon nitride layer. The removal rate of silicon dioxide to silicon nitride should be at least greater than 3. Accordingly, another object of the present invention is to provide a chemical-mechanical abrasive composition for use in the polishing of semiconductor devices, which composition is able to provide a ratio of greater than 3 of the removal rate of silicon dioxide to that of silicon nitride.

As for the polishing of metals, for example, in the copper processes for producing semiconductors, the polishing method should involve several steps. In the first step, as shown in FIG. 2(a), an abrasive slurry is used to polish the copper film of a semiconductor and stops at the tantalum nitride (TaN) layer, wherein the ratio of the removal rate of the copper film to that of the tantalum nitride layer should be at least greater than 3. In the second step, as shown in FIG. 2(b), another abrasive slurry is used to polish the tantalum nitride layer and the copper film of the semiconductor and stops at a dielectric layer, wherein the ratio of the removal rate of the tantalum nitride layer to that of the copper film should be at least greater than 1. Since in the first and second steps, the copper film may be subjected to a dishing phenomenon, a third step of over-polishing, as shown in FIG. 2(c), may be needed. The third abrasive slurry used in the third step should achieve a removal rate of the dielectric layer that is greater than or the same as that of the copper film and tantalum nitride layer. The polishing technology for metals has been disclosed in prior patents. For example, U.S. Pat. No. 5,114,437 discloses a polishing composition for an aluminum substrate, said composition comprising an alumina polishing agent having an average particle size of 0.2 to 5 $\mu$m, and a polishing accelerator selected from the group consisting of chromium(III) nitrate, lanthanium nitrate, ammonium cerium(III) nitrate, and neodymium nitrate. U.S. Pat. No. 5,209,816 discloses a method for polishing an Al- or Ti-containing metal layer with a chemical-mechanical abrasive slurry. The abrasive slurry contains, in addition to a solid abrasive material, about 0.1–20% by volume of $H_3PO_4$ and about 1–30% by volume of $H_2O_2$. U.S. Pat. No. 5,225,034 discloses a chemical-mechanical abrasive slurry, which comprises $AgNO_3$, solid abrasive particles, and an oxidant selected from $H_2O_2$, HOCl, KOCl, $KMgO_4$, or $CH_3COOOH$. The slurry is used for polishing the copper layer on a semiconductor wafer so as to produce copper wires on the wafer. U.S. Pat. No, 5,340,370 discloses a chemical-mechanical polishing slurry for tungsten or tungsten nitride film, which comprises an oxidizing agent such as potassium ferricyanide, an abrasive, and water, and has a pH range between 2 and 4, U.S. Pat. No. 5,516,346 discloses a slurry for chemical mechanically polishing a titanium film, said slurry comprising potassium fluoride in a concentration sufficient to complex with said titanium film and an abrasive such as silica, and having a pH level less than 8.

Yet another object of the present invention is to provide a chemical-mechanical abrasive composition which can effectively improve the removal rate of metals. Depending on different IC pattern designs and different semiconductor processes, the chemical-mechanical composition of the invention can provide the sane or different abrasion selectivities to the metal wires and dielectric layers in integrated circuits.

SUMMARY OF THE INVENTION

Figure 1:
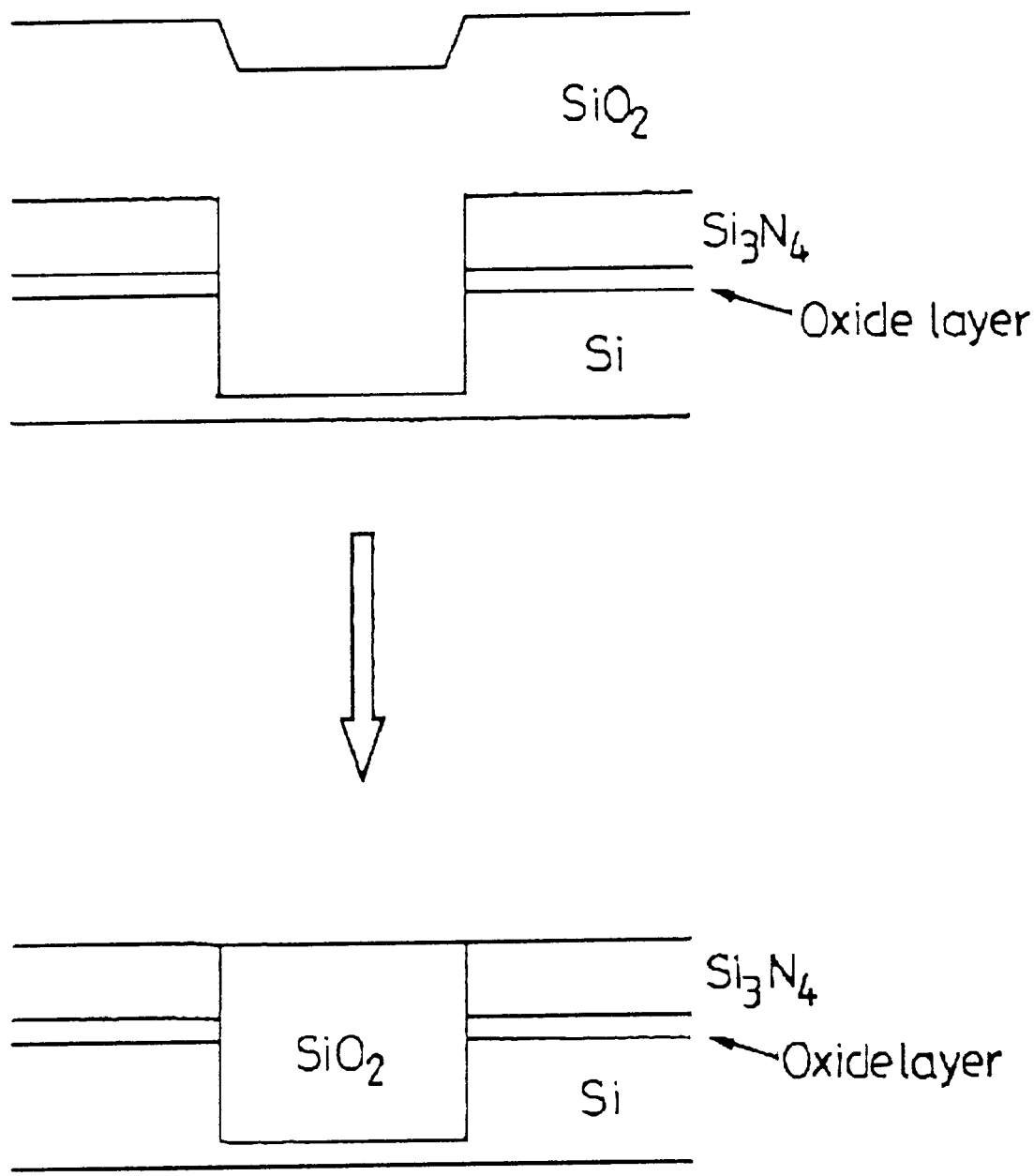
FIG. 1 schematically shows the planarization of $SiO_2$ in a semiconductor process.

The invention provides a chemical-mechanical abrasive composition for use in semiconductor processing, which comprises an aqueous medium, an abrasive, and an abrasion accelerator. The abrasion accelerator mainly functions to enhance the removal rate of the substances to be removed, and is selected from the compounds of the following formula, the acid-addition salts thereof, or mixtures of two or more of the foregoing compounds and salts:

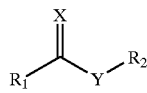

wherein X and Y are independently lone-pair electrons containing atoms or atomic groups; and $R_1$ and $R_2$ are independently H, alkyl, amino, aminoalkyl, or alkoxy. The chemical-mechanical abrasive composition of the invention may optionally comprise an acidic component and/or the salt thereof, so as to further enhance the abrasion rate.

The invention further provides a method of using the above chemical-mechanical abrasive composition for polishing the surface of a semiconductor wafer.

DETAILED DESCRIPTION OF THE INVENTION

The invention relates to a chemical-mechanical abrasive composition for effectively polishing the surface of a semiconductor wafer, said composition comprising an aqueous media, an abrasive, and an abrasion accelerator. The abrasive composition of the invention may comprise from 0.1 to 30% by weight, and preferably from 3 to 25% by weight of the abrasive, and from 0.01 to 5% by weight, and preferably 0.03 to 2% by weight of the abrasion accelerator.

In IC processing, the entire planarization of a wafer surface is accomplished by chemical-mechanical abrasion. During the chemical-mechanical abrasion, the substances removed from the wafer surface may re-bond to the wafer surface and be deposited on the wafer surface. This will not only reduce the abrasion rate and the planarization extent, but also cause defects to form on the wafer surface. Consequently, there is a need for compounds with a chelation ability to facilitate the removal of the substances to be removed from the wafer surface, so as to avoid the re-bonding of these substances to the wafer surface. The present invention provides an abrasion accelerator with a better chelation property.

The abrasion accelerator of the invention is selected from the compounds of the following formula, the acid-addition salts thereof, and mixtures of two or more of the foregoing compounds and salts:

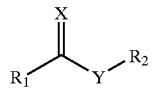

wherein X and Y are independently lone-pair electrons containing atoms or atomic groups, such as oxygen atoms, sulfur atoms, or the NH groups; and $R_1$ and $R_2$ are independently H, $C_1$–$C_6$ akyl, amino, amino$C_1$–$C_6$alkyl, or $C_1$–$C_6$alkoxy.

The mechanism involved by the abrasion accelerator compounds of the invention to chelate the atoms or atomic soups of substances, thereby removing said substances, is believed to be as follows:

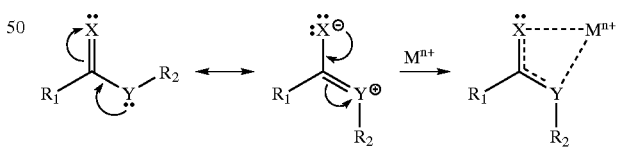

wherein M is an atom or atomic group of the substances to be removed, and n is the valence charge of M.

It was surprisingly found that the abrasive composition of the invention can enhance the abrasion rate no matter whether the abrasion is conducted in an acidic, neutral, or basic condition.

The abrasive used in the abrasive composition of the invention can be any commercially available abrasive, such as $SiO_2$, $Al_2O_3$, $ZrO_2$, $CeO_2$, SiC, $Fe_2O_3$, $TiO_2$, $Si_3N_4$, or a mixture thereof. These abrasives normally have the advantages of high purity, high surface area, and narrow particle size distribution, and are thus suitable for use in abrasive compositions as abrasive particles.

When applied to different processes, the chemical-mechanical abrasive composition of the invention can be formulated to have a desired constitution by altering the species and concentration of the abrasion accelerator or the amount of the abrasive particles. The abrasion accelerators which are suitable or use in the invention may include, for example, methyl glycinate, glycinamide, aminoguanidine, semicarbazide, guanidine, urea, formamidine, acetamidine, formamide, acetamide, formyl hydrazide, acethydrazide, ethyl glycinate, methyl carbazate, ethyl carbazate, methyl carbamate, or ethyl carbamate, or an acid-addition salt thereof, such as the hydrochloride, nitrate, carbonate, or sulfate salt thereof, or a derivative with a similar structure thereof, or a mixture of two or more of the foregoing compounds. Preferably, the abrasion accelerator is selected from the group consisting of methyl glycinate hydrochloride, glycinamide hydrochloride, aminoguanidine carbonate, semicarbazide hydrochloride, guanidine carbonate, and a mixture thereof.

The chemical-mechanical abrasive composition of the invention may optionally comprise from 0.001 to 2% by weight of an acidic component and/or the salt thereof to further enhance the abrasion rate. The acidic component, which may be used in the present invention, could be any commercially available acid, such as nitric acid, hydrogen chloride, carbonic acid, sulfuric acid, sulfurous acid, phosphoric acid, phosphorous acid, chloric acid, bromic acid, iodic acid, perchloric acid, perbromic acid, periodic acid, formic acid, acetic acid, propionic acid, butyric acid, valeric acid, hexanoic acid, malonic acid, succinic acid, glutaric acid, dipic acid, glycolic acid, lactic acid, citric acid, malic acid, tartaric acid, oxalic acid, glycine, creatine, dimethylglycine, or alanine, or a mixture thereof. For example, the composition of the invention may comprise ammonium carbonate to further enhance the abrasion rate.

The chemical-mechanical abrasive composition of the present invention ay use water as a medium. In the preparation of the abrasive composition, water, and preferably conventional deionized water, may be used to make the abrasive composition to be in the form of a slurry.

The chemical mechanical abrasive composition of the present invention may further comprise other ingredients which are conventionally used in chemical mechanical abrasive compositions, only if they do not cause any adverse effect on the abrasive composition of the present invention. Therefore, the chemical-mechanical abrasive composition of the present invention may optionally comprise 0.1 to 10%, preferably 0.1 to 5% and more preferably 1 to 3% by weight of an oxidant conventionally used in the art, such as $H_2O_2$, $Fe(NO_3)_3$, $KIO_3$, $CH_3COOOH$, or $KMnO_4$.

The present invention will be further described by, but not limited to, the following examples. Any modifications or changes with reference to the present invention, which can be easily accomplished by persons skilled in the art, are to be encompassed in the scope of the present invention.

EXAMPLES

Abrasion Test

A. Species of wafer for abrasion test:

| Species of film | Formation of film | Deposition thickness (Å) |
| --- | --- | --- |
| TEOS | Chemical vapor deposition | 8000 |
| $SiO_2$ | Thermal oxidation | 8000 |
| $Si_3N_4$ | Chemical vapor deposition | 3000 |
| W | Chemical vapor deposition | 8000 |
| TaN | Chemical vapor deposition | 5000 |
| Cu | Chemical vapor deposition | 8000 |
| TiN | Cheimical vapor deposition | 5000 |

B. Abrasion platen: IPEC/Westech 472

C. Temperature: 25° C.

D Pad type: IC 1400 manufactured by Rodel Company

E. Flow rate of slurry: 150 ml/min

Abrasion Test Procedure

The thickness of a dielectric layer can be directly determined by an optical method. The present invention used Model SM 300, manufactured by KLA-Tencor Company, to determine the thickness of a dielectric layer. The thickness of a metal layer is determined by using Model RS 75, manufactured by KLA-Tencor Company.

Both before and after an abrasion test, the thickness of a film should be measured by a thickness measuring means. The sheet resistivity of a metal film is measured by a 4-point probe. The thickness of the film is determined by the following equation:

$$T \times R = \text{resistivity coefficient}$$

wherein T represents film thickness (Å), and R represents sheet resistivity ($\Omega/cm^2$). For various metal films, the resistivity coefficient will be a constant.

The abrasion rate is determined as follows:

A metal film thickness $T_1$ is first determined by the above apparatus of Model RS75. The film is polished by an exemplified slurry illustrated in the following examples for 1 minute. Thereafter, the wafer is cleaned by Evergreen Model 10X, commercially available from the Solid State Equipment Corporation. After spray-drying the wafer, a metal film thickness $T_2$ is measured by the apparatus of Model RS75. The abrasion rate of the metal film is represented by $T_1-T_2$.

EXAMPLE 1

Chemical-mechanical abrasive slurries respectively containing methyl glycinate hydrochloride, glycinamide hydrochloride, and aminoguandine carbonate were prepared. The resultant slurries were used to polish TEOS film under the following conditions:

Pressure: 5 psi

Spindle speed: 60 rpm

Platen speed: 50 rpm

The results of the abrasion test for the resultant slurries are listed in Table 1.

TABLE 1

| Run | Abrasive | Solid content (wt. %) | Abrasion accelerator/ Amount (wt. %) | pH | TEOS removal rate (Å/min) |
|---|---|---|---|---|---|
| 1 | Silica gel | 18 | Methyl glycinate hydrochloride/0.2 | 2.5 | 2838 |
| 2 | Silica gel | 18 | Methyl glycinate hydrochloride/0.2 | 7 | 2462 |
| 3 | Silica gel | 18 | Glycinamide hydrochloride/0.2 | 4.5 | 2641 |
| 4 | Silica gel | 28 | Aminoguanidine carbonate/0.2 | 10.8 | 3537 |
| 5 | Silica gel | 20 | Aminoguanidine carbonate/0.2 | 10.5 | 2908 |
| 6 | Silica gel | 15 | Aminoguanidine carbonate/0.2 | 10.4 | 2078 |

The above results reveal that the chemical-mechanical compositions of the present invention can enhance the abrasion rate in conditions with acidic to basic pH values.

EXAMPLE 2

Chemical-mechanical abrasive slurries respectively containing semicarbazide hydrochloride, aminogliamdine carbonate, and guanidine carbonate were prepared. The resultant slurries were used to polish $SiO_2$ film under the following conditions:

Pressure: 5 psi

Spindle speed: 70 rpm

Platen speed: 50 rpm

The results of the abrasion test for the resultant slurries are listed in Table 2.

TABLE 2

| Run | Abrasive | Solid content (wt. %) | Abrasion accelerator/ Amount (wt. %) | pH | TEOS removal rate (Å/min) |
|---|---|---|---|---|---|
| 1 | Fumed silica | 10 | Semicarbazide hydrochloride/0.2 | 10 | 1858 |
| 2 | Fumed silica | 10 | Aminoguanidine carbonate/0.2 | 10 | 1523 |
| 3 | Fumed silica | 10 | Guanidine carbonate/0.2 | 10 | 1405 |

EXAMPLE 3

Chemical-mechanical abrasive slurries respectively containing aminoguanidine carbonate, senucarbazide hydrochloride, and guanidine carbonate were prepared. The resultant slurries were used to polish TEOS and silicon nitride films under the following conditions:

Pressure: 5 psi

Spindle speed: 70 rpm

Platen speed: 50 rpm

The results of the abrasion test for the resultant slurries are listed in Table 3.

TABLE 3

| Run | Abrasive | Solid content (wt. %) | Abrasion accelerator/ Amount (wt. %) | pH | TEOS removal rate (Å/min) | $Si_3N_4$ removal rate (Å/min) | TEOS removal rate/$Si_3N_4$ removal rate |
|---|---|---|---|---|---|---|---|
| 1 | Fumed silica | 15 | Aminoguanidine carbonate/0.2 | 10 | 2548 | 785 | 3.2 |
| 2 | Fumed silica | 10 | Aminoguanidine carbanate/0.5 Ammonium carbonate*/0.25 | 10 | 1811 | 513 | 3.5 |
| 3 | Fumed silica | 15 | Semicarbazide hydrachloride/0.2 | 10 | 2801 | 732 | 3.8 |
| 4 | Fumed silica | 10 | Semicarbazide hydrochloride/0.2 | 10 | 1858 | 557 | 3.3 |
| 5 | Fumed silica | 10 | Semicarbazide hydrochloride/0.5 Ammonium carbonate/0.25 | 10 | 2220 | 518 | 4.3 |
| 6 | Fumed silica | 15 | Guanidine carbonate/0.2 | 10 | 1405 | 432 | 3.3 |
| 7 | Fumed silica | 10 | Guanidine carbonate/0.2 | 10 | 2542 | 774 | 3.3 |

*Ammonium carbonate is added to further enhance the removal rate

The above results show that the abrasive compositions of the present invention achieve desired removal rate of TEOS relative to that of silicon nitride, and thus achieve desired abrasion selectivities.

EXAMPLE 4

Chemical-mechanical abrasive slurries respectively containing semicarbazide hydrochloride, aminoguanidine carbonate, and guanidine carbonate, and having a pH value ranging from 3.8 to 4.6 were prepared. The resultant slurries were used to polish copper, tantalum nitride, and TEOS films under the following conditions:

Pressure: 4 psi

Back pressure: 0.5 psi

Spindle speed: 55 rpm

Platen speed: 50 rpm

The results of the abrasion test for the resultant slurries are listed in Table 4.

TABLE 4

| Run | Abrasive | Solid content (wt. %) | Abrasion accelerator/ Amount (wt. %) | Oxidant/ Amount (wt. %) | Cu removal rate (Å/min) | TaN removal rate (Å/min) | TEOS removal rate (Å/min) |
|---|---|---|---|---|---|---|---|
| 1 | Silica gel | 15 | Semicarbazide hydrochloride/0.2 | $H_2O_2$/3 | 3729 | 802 | 1698 |
| 2 | Silica gel | 10 | Semicarbazide hydrochloride/0.2 | $H_2O_2$/3 | 4097 | 469 | 1278 |
| 3 | Silica gel | 15 | Aminoguanidine carbonate/0.2 | $H_2O_2$/3 | 416 | 1505 | 1495 |
| 4 | Silica gel | 10 | Aminoguanidine carbonate/0.2 | $H_2O_2$/3 | 289 | 807 | 1039 |
| 5 | Silica gel | 15 | Guanidine carbonate/0.2 | $H_2O_2$/3 | 266 | 1631 | 1597 |
| 6 | Silica gel | 10 | Guanidine carbonate/0.2 | $H_2O_2$/3 | 377 | 1413 | 1164 |

Figure 2:
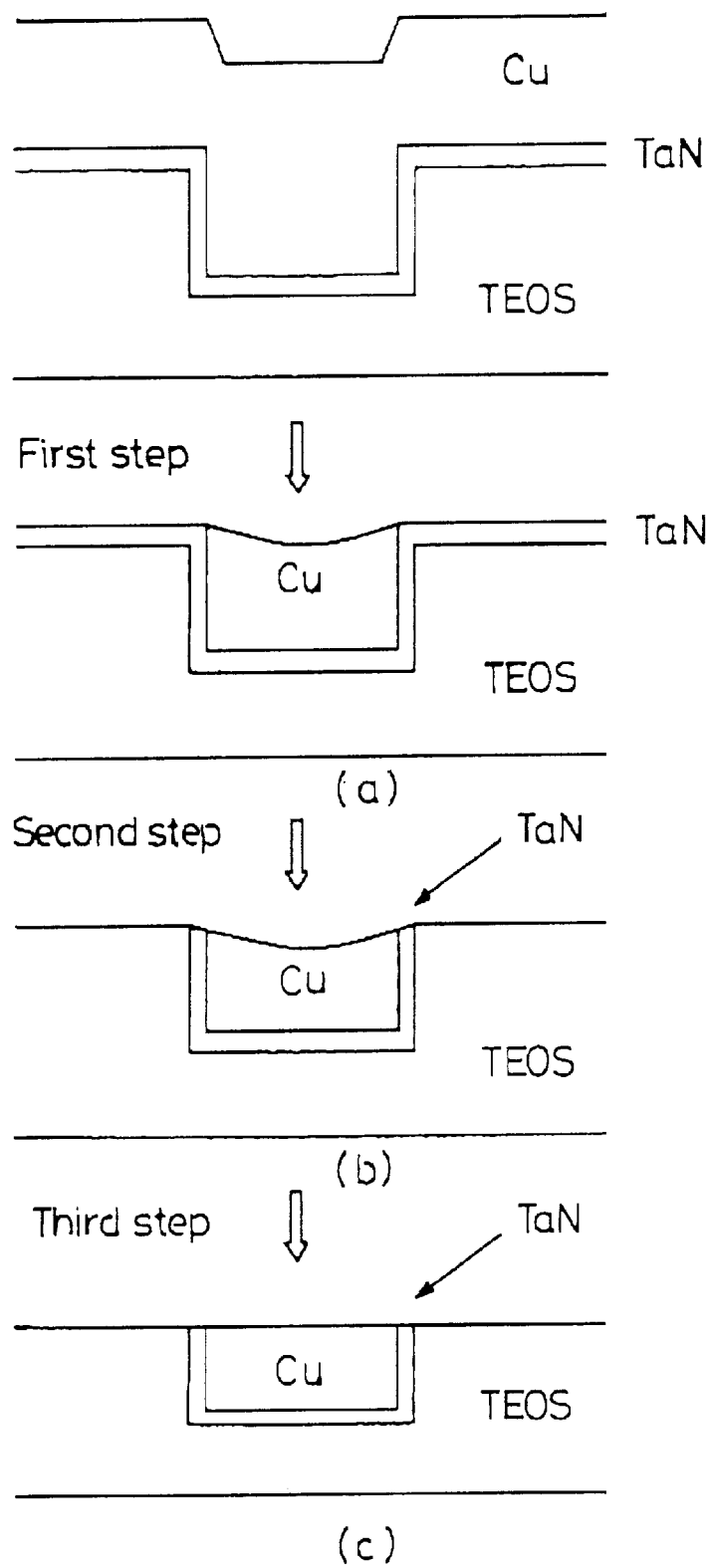
FIG. 2 schematically shows the polishing steps used in a copper process for producing semiconductors.

The abrasive compositions illustrated in Example 4 can be used in semiconductor abrasion processing to produce a pattern as shown in FIG. 2. For example, the abrasive compositions of Run 1 and Run 2 can be used in the first step; the abrasive composition of Run 3 can be used in the second step; and the abrasive compositions of Run 4 to Run 6 can be used in the third step.

EXAMPLE 5

Chemical-mechanical abrasive slurries respectively containing semicarbazide hydrochloride, aminoguanidine carbonate, and guanidine carbonate, and having a pH value ranging from 3.8 to 4.6 were prepared. The resultant slurries were used to polish tungsten, titanium nitride, and silicon dioxide films under the following conditions:

Pressure: 5 psi
Spindle speed: 70 rpm
Platen speed: 50 rpm

The results of the abrasion test for the resultant slurries are listed in Table 5.

TABLE 5

| Run | Abrasive | Solid content (wt. %) | Abrasion accelerator/ Amount (wt. %) | Oxidant/ Amount (wt. %) | W metal removal rate (Å/min) | TiN removal rate (Å/min) | $SiO_2$ removal rate (Å/min) |
|---|---|---|---|---|---|---|---|
| 1 | Silica gel | 10 | Aminoguanidine carbonate/0.2 | $H_2O_2$/3 | 2585 | 4402 | 1059 |
| 2 | Silica gel | 10 | Guanidine carbonate/0.2 | $H_2O_2$/3 | 1238 | 3913 | 1156 |
| 3 | Silica gel | 10 | Guanidine carbonate/0.2 | $H_2O_2$/1.5 | 542 | 5298 | 960 |
| 4 | Silica gel | 15 | Guanidine carbonate/0.2 | $H_2O_2$/0.5 | 472 | 3914 | 1861 |
| 5 | Silica gel | 10 | Guanidine carbonate/0.2 | $H_2O_2$/0.5 | 331 | 3956 | 1342 |
| 6 | Silica gel | 10 | Semicarbazide hydrochloride/0.2 | $H_2O_2$/1.5 | 457 | 5309 | 1042 |

We claim:

1. A chemical-mechanical abrasive composition comprising an aqueous medium, an abrasive, and an abrasion accelerator, said abrasion accelerator being selected from the compounds of the following formula, the acid-addition salts thereof, or mixtures of two or more of the foregoing compounds and salts:

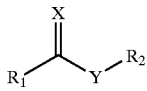

wherein X and Y are independently lone-pair electrons containing atoms or atomic groups; and $R_1$ and $R_2$ are independently H, $C_1$–$C_6$alkyl, amino, amino$C_1$–$C_6$alkyl, or $C_1$–$C_6$alkoxy.

2. The composition according to claim 1 wherein the X and Y are independently selected from O, S, and NH.

3. The composition according to claim 1 wherein the abrasive is selected from $SiO_2$, $Al_2O_3$, $ZrO_2$, $CeO_2$, SiC, $Fe_2O_3$, $TiO_2$, $Si_3N_4$, or a mixture thereof.

4. The composition according to claim 1 comprising 0.1–30% by weight of said abrasive.

5. The composition according to claim 4 comprising 3–25% by weight of said abrasive.

6. The composition according to claim 1 comprising 0.01–5% by weight of said abrasion accelerator.

7. The composition according to claim 6 comprising 0.03–2% by weight of said abrasion accelerator.

8. A composition according to claim 1 wherein said abrasion accelerator is selected from the group consisting of methyl glycinate, glycinamide, aminoguanidine, semicarbazide, guanidine, urea, formamidine, acetamidine, formamide, acetamide, formyl hydrazine, acethydrazide, ethyl glycinate, methyl carbazate, ethyl carbazate, methyl carbamate, ethyl carbamate, an acid-addition salt thereof and mixtures thereof.

9. The composition according to claim 8 wherein said abrasion accelerator is selected from the group consisting of methyl glycinate hydrochloride, glycinamide hydrochloride, aminoguanidine carbonate, semnicarbazide hydrochloride, guanidine carbonate, and a mixture thereof.

10. The composition according to claim 1 further comprising an acidic component, a salt thereof or a mixture of an acidic component and a salt thereof.

11. The composition according to claim 10, wherein said acidic component is selected from the group consisting of nitric acid, hydrogen chloride, carbonic acid, sulfuric acid, sulfurous acid, phosphoric acid, phosphorous acid, chloric acid, bromic acid, iodic acid, perchloric acid, perbromic acid, periodic acid, formic acid, acetic acid, propionic acid, butyric acid, valeric acid, hexanoic acid, malonic acid, succinic acid, glutanic acid, dipic acid, glycolic acid, lactic acid, citric acid, malic acid, tartaric acid, oxalic acid, glycine, creatine, dimethylglycine, alanine, and a mixture thereof.

12. The composition according to claim 10 wherein the salt is ammonium carbonate.

13. The composition according to claim 1 further comprising an oxidant.

14. A method for polishing the surface of a semiconductor wafer comprising applying a chemical-mechanical abrasive composition as defined in any of claims 1 to 13 to the surface of the semiconductor wafer.

* * * * *